United States Patent
Camacho et al.

(10) Patent No.: US 8,138,595 B2
(45) Date of Patent: Mar. 20, 2012

(54) INTEGRATED CIRCUIT PACKAGING SYSTEM WITH AN INTERMEDIATE PAD AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 178 days.

(21) Appl. No.: 12/732,423

(22) Filed: Mar. 26, 2010

(65) Prior Publication Data

US 2011/0233752 A1    Sep. 29, 2011

(51) Int. Cl.
*H01L 23/52* (2006.01)

(52) U.S. Cl. .................. 257/692; 257/E23.06; 257/670; 257/690; 257/730; 438/123; 438/124

(58) Field of Classification Search ............. 257/E23.06, 257/E21.504, E21.506, E21.509, 692, 690, 257/676, 667, 670, 730, 735, 738, 784; 438/117, 438/123–126

See application file for complete search history.

(56) References Cited

U.S. PATENT DOCUMENTS

| | | | |
|---|---|---|---|
| 5,656,550 A | 8/1997 | Tsuji et al. | |
| 5,804,468 A * | 9/1998 | Tsuji et al. | 438/122 |
| 6,232,561 B1 | 5/2001 | Schmidt et al. | |
| 6,313,519 B1 | 11/2001 | Gainey et al. | |
| 6,573,121 B2 | 6/2003 | Yoneda et al. | |
| 6,818,973 B1 * | 11/2004 | Foster | 257/676 |
| 6,908,843 B2 | 6/2005 | Baldonado et al. | |
| 6,927,096 B2 | 8/2005 | Shimanuki | |
| 6,927,483 B1 | 8/2005 | Lee et al. | |
| 6,946,324 B1 * | 9/2005 | McLellan et al. | 438/111 |
| 6,995,460 B1 * | 2/2006 | McLellan et al. | 257/676 |
| 7,019,389 B2 * | 3/2006 | Lai et al. | 257/666 |
| 7,049,177 B1 * | 5/2006 | Fan et al. | 438/123 |
| 7,060,535 B1 * | 6/2006 | Sirinorakul et al. | 438/123 |
| 7,081,403 B1 * | 7/2006 | Kirloskar et al. | 438/612 |
| 7,095,100 B2 * | 8/2006 | Kasuya | 257/678 |
| 7,144,517 B1 | 12/2006 | Yang et al. | |
| 7,226,811 B1 * | 6/2007 | McLellan et al. | 438/111 |
| 7,247,526 B1 | 7/2007 | Fan et al. | |
| 7,271,032 B1 * | 9/2007 | McLellan et al. | 438/111 |
| 7,285,444 B2 * | 10/2007 | Danno | 438/111 |
| 7,323,765 B2 | 1/2008 | Lam | |
| 7,335,529 B2 | 2/2008 | Miyaki et al. | |
| 7,459,347 B2 | 12/2008 | Shimanuki et al. | |
| 7,556,987 B2 * | 7/2009 | Dimaano et al. | 438/123 |
| 7,683,461 B2 * | 3/2010 | Lau | 257/666 |
| 7,790,500 B2 * | 9/2010 | Ramos et al. | 438/106 |

(Continued)

OTHER PUBLICATIONS

U.S. Appl. No. 12/329,467, filed Dec. 5, 2008, Camacho.

(Continued)

*Primary Examiner* — Chris Chu
(74) *Attorney, Agent, or Firm* — Mikio Ishimaru

(57) ABSTRACT

A method of manufacture of an integrated circuit packaging system includes: forming an elevated contact above and between a lead and a die pad that is coplanar with the lead; connecting an integrated circuit and the lead; attaching a jumper interconnect between the elevated contact and the lead; and forming an encapsulant over the integrated circuit, the lead, the die pad, the elevated contact, and the jumper interconnect, the encapsulant having a recess in a base side with the elevated contact exposed in the recess and the lead exposed from the base side.

20 Claims, 3 Drawing Sheets

U.S. PATENT DOCUMENTS

| | | |
|---|---|---|
| 7,807,498 B2 | 10/2010 | Shoji et al. |
| 7,858,443 B2 | 12/2010 | Powell et al. |
| 2001/0035569 A1* | 11/2001 | Shibata .......................... 257/667 |
| 2004/0070056 A1* | 4/2004 | Matsuzawa et al. ........... 257/666 |
| 2007/0235854 A1* | 10/2007 | Camacho et al. .............. 257/690 |
| 2009/0283882 A1* | 11/2009 | Hsieh et al. ................... 257/676 |
| 2010/0006992 A1 | 1/2010 | Dirks |
| 2011/0233753 A1* | 9/2011 | Camacho et al. .............. 257/692 |

OTHER PUBLICATIONS

U.S. Appl. No. 12/732,465, filed Mar. 26, 2010, Camacho et al.

* cited by examiner

INTEGRATED CIRCUIT PACKAGING SYSTEM WITH AN INTERMEDIATE PAD AND METHOD OF MANUFACTURE THEREOF

CROSS-REFERENCE TO RELATED APPLICATION(S)

The present application contains subject matter related to a concurrently filed U.S. Patent Application by Zigmund Ramirez Camacho, Emmanuel Espiritu, and Henry Descalzo Bathan entitled "Integrated Circuit Packaging System with Leads and Method of Manufacture Thereof". The related application is assigned to STATS ChipPAC Ltd. and is identified by U.S. patent application Ser. No. 12/732465. The subject matter thereof is incorporated herein by reference thereto.

TECHNICAL FIELD

The present invention relates generally to an integrated circuit packaging system, and more particularly to a connection package system.

BACKGROUND ART

Market growth for high density and high output/input integrated circuit packages has resulted in a trend for electronic products that are lightweight, smaller in size, multi-functional, and with ever increasing higher speeds. Products must compete in world markets and attract many consumers or buyers in order to be successful.

It is very important for products to continue to improve in features, performance, and reliability while reducing product costs, product size, and equally important to be available quickly for purchase by the consumers or buyers. Electronic products such as cell phone base products, global positioning systems (GPS), satellites, communication equipment, consumer products, and a vast line of other similar products are in ever increasing global demand.

Therefore, there is an important need for smaller packages. Circuitry within the smaller packages needs to be electrically connected with other parts and components inside the packages. As the smaller packages with more circuits continue to shrink in size, there is a greater need to produce the smaller packages with more and more package connectors to support continually increasing amounts of electrical connections inside within those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections is spaced apart from one another. The smaller packages and their electrical connections must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability, and increase product yields to meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an elevated contact above and between a lead and a die pad that is coplanar with the lead; connecting an integrated circuit and the lead; attaching a jumper interconnect between the elevated contact and the lead; and forming an encapsulant over the integrated circuit, the lead, the die pad, the elevated contact, and the jumper interconnect, the encapsulant having a recess in a base side with the elevated contact exposed in the recess and the lead exposed from the base side.

The present invention provides an integrated circuit packaging system, including: an elevated contact above and between a lead and a die pad that is coplanar with the lead; an integrated circuit connected to the lead; a jumper interconnect attached between the elevated contact and the lead; and an encapsulant over the integrated circuit, the lead, the die pad, the elevated contact, and the jumper interconnect, the encapsulant having a recess in a base side with the elevated contact exposed in the recess and the lead exposed from the base side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
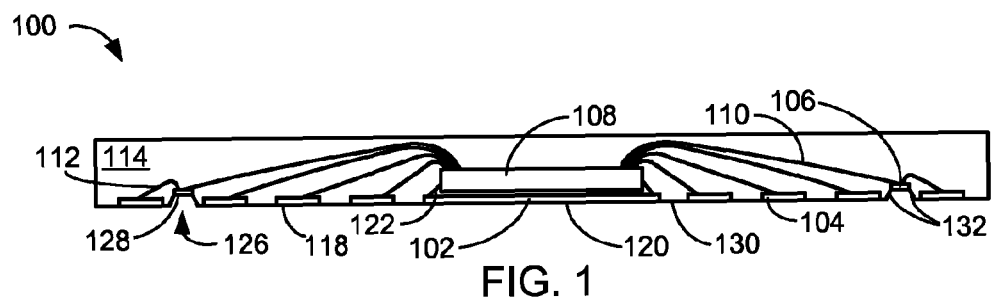
FIG. 1 is a cross-sectional view of an integrated circuit packaging system taken along a line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
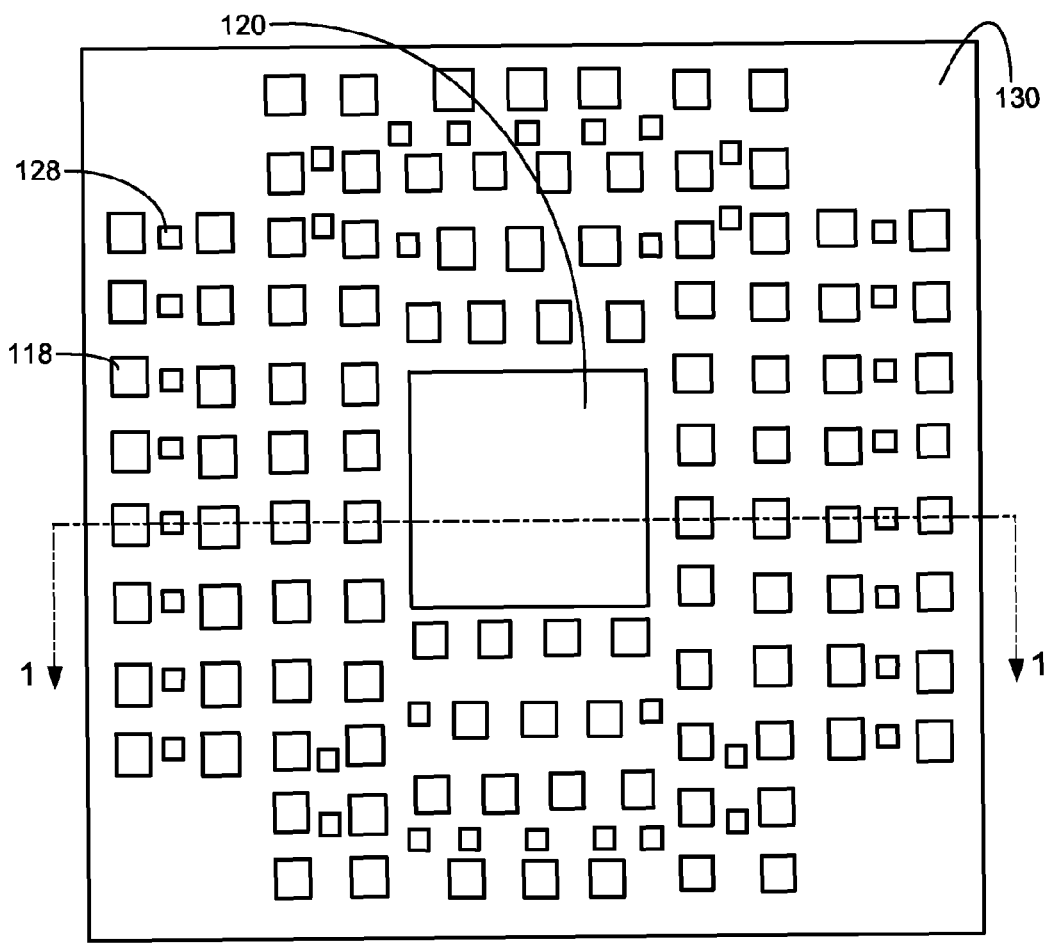
FIG. 2 is a bottom view of the integrated circuit packaging system of FIG. 1.

Referring now to FIG. 1, therein is shown a cross-sectional view of an integrated circuit packaging system 100 taken along a line 1-1 of FIG. 2 in an embodiment of the present invention. The integrated circuit packaging system 100 can preferably include a die pad 102, leads 104, elevated contacts 106, an integrated circuit 108, interconnects 110, jumper interconnects 112, and an encapsulation 114.

The die pad 102 can be formed from conductive materials including metals, alloys, a nickel and palladium material (NiPd), conductive compounds, or any combination thereof. The die pad 102 can be used to provide thermal conductivity between the integrated circuit packaging system 100 and a next level of system integration (not shown) such as a circuit board, another package, or other electrical components.

The leads 104 can be formed from the metals, the alloys, the NiPd material, or any combination thereof. The leads 104 can oriented around the die pad 102 and include a lead surface 118 coplanar with a die pad surface 120 of the die pad 102. The leads 104 can be used to provide connectivity between the integrated circuit packaging system 100 and the next level of system integration.

The integrated circuit 108, such as a wire bond chip, an integrated circuit package, or a multiple chip module, can be mounted over a side of the die pad 102 opposite the die pad surface 120 using an attachment layer 122. The attachment layer 122 is an adhesive, a glue, or a thermal conductive compound. An active side of the integrated circuit 108 can be oriented facing away from the die pad 102.

The elevated contacts 106 are pads, contacts, or bumps having an exposed surface 128. The elevated contacts 106 can be formed from the same material as the leads 104 or other conductive materials. The elevated contacts 106 are formed above the leads 104 and the die pad 102.

The elevated contacts 106 can be oriented between the leads 104 or between the leads 104 and the die pad 102. There can be any number of the elevated contacts 106. As an example, the integrated circuit packaging system 100 could be implemented with a single one of the elevated contacts 106.

The elevated contacts 106 can be connected to one or more of the leads 104 closest to the elevated contacts 106 using jumper interconnects 112. The jumper interconnects 112 have one end attached on a side of the elevated contacts 106 opposite the exposed surface 128 and another end attached on a side of the leads 104 opposite the lead surface 118. The jumper interconnects 112 is defined as bond wires or conductive wires. The jumper interconnects 112 and the elevated contacts 106 can be formed and located over areas having problems such as areas with limited wiring space or component obstructions.

The interconnects 110 can include bond wires or conductive wires. The interconnects 110 are attached between the active side of the integrated circuit 108 and the side of the elevated contacts 106 opposite the exposed surface 128. The interconnects 110 can be attached between the active side of the integrated circuit 108 and the side of the leads 104 opposite the lead surface 118. The interconnects 110 provide connectivity between the integrated circuit 108 and the leads 104 or the elevated contacts 106.

The encapsulation 114 can cover the leads 104, the elevated contacts 106, the jumper interconnects 112, the interconnects 110, the die pad 102, and the integrated circuit 108. The encapsulation 114 can be used to protect the integrated circuit packaging system 100.

The encapsulation 114 can include a recess 126 used to expose the exposed surface 128 from a base side 130 of the encapsulation 114. The recess 126 can be formed with sides 132 of the encapsulation 114. The lead surface 118 and the die pad surface 120 can be exposed from the base side 130 of the encapsulation 114.

For illustrative purposes, the recess 126 is shown having a cross-sectional profile of an isosceles trapezoid with the sides 132 non-horizontal and having an oblique angle relative to the base side 130. The recess 134 can have other cross-sectional profiles and sides. As an example, the recess can have a cross-sectional profile of a rectangle with sides perpendicular to the base side 130.

It has been discovered that the present invention provides the integrated circuit packaging system 100 with improved reliability, yield, and cost savings. The elevated contacts 106 and the jumper interconnects 112 prevent shorting between the interconnects 110. The elevated contacts 106 and the jumper interconnects 112 provide a means of connecting and bridging over regions of wiring congestion and thus eliminate shorts, resulting in higher product yields and manufacturing cost savings. The elevated contacts 106 and the jumper interconnects 112 can eliminate the need for long wires such as the interconnects 110 that span from the integrated circuit 108 towards edges of the integrated circuit packaging system 100 and provide more vertical clearance between the leads 104 to avoid collapsing of the long wires thereby improving reliability and yields.

Referring now to FIG. 2, therein is shown a bottom view of the integrated circuit packaging system 100 of FIG. 1. Shown is the die pad surface 120 exposed from the base side 130 in direct contact with edges of the die pad surface 120. The lead surface 118 of each of the leads 104 of FIG. 1 are shown distributed around the die pad surface 120 and exposed from the base side 130.

The exposed surface 128 of each of the elevated contacts 106 of FIG. 1 is shown offset from the lead surface 118 and the die pad surface 120. The exposed surface 128 is exposed from the base side 130 and can be formed anywhere adjacent to the lead surface 118 or the die pad surface 120.

It has been discovered that the present invention provides the integrated circuit packaging system 100 with improved attachment characteristics. The exposed surface 128 exposed from the base side 130 can be used as a probe contact point for the purposes of testing the integrated circuit packaging system 100 and thus preserve and prevent the lead surface 118 from manufacturing probe marks, scratches, or dents to provide a pristine attachment surface for the next level of system integration.

Figure 3:
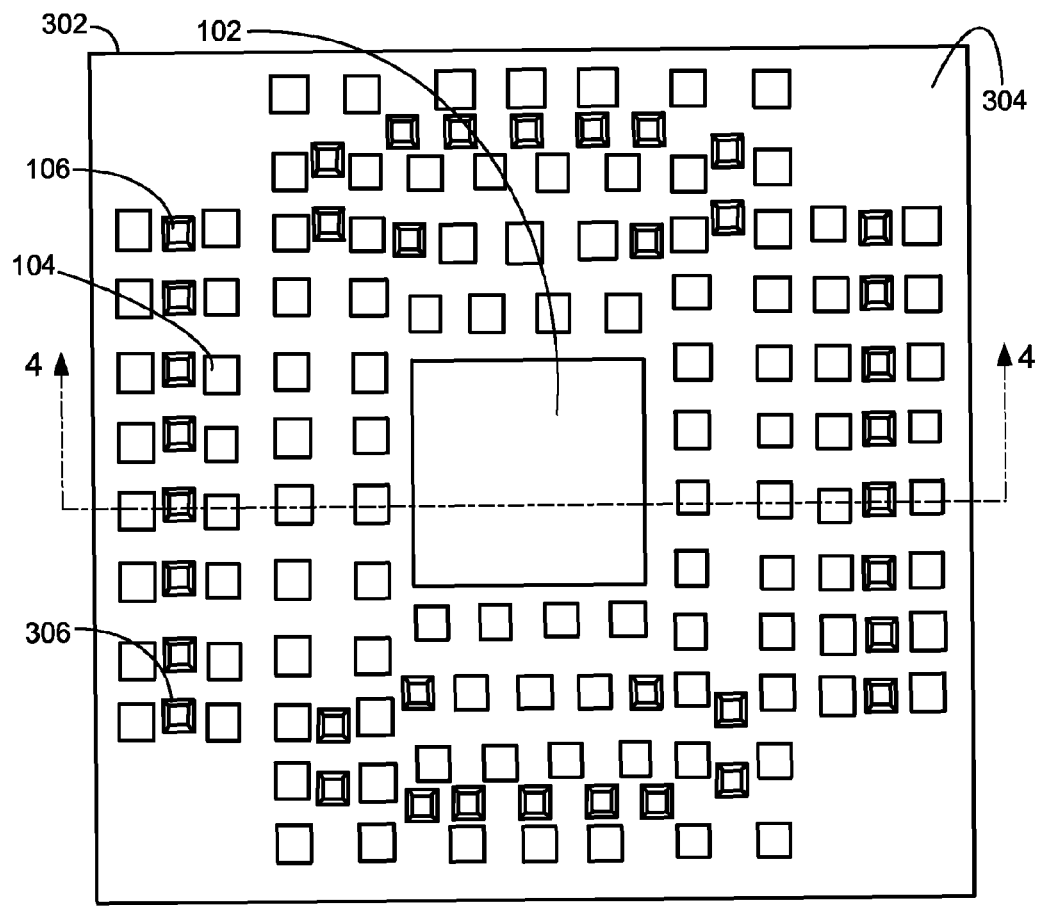
FIG. 3 is a top view of a panel in a formation phase for manufacture of the integrated circuit packaging system of FIG. 1.

Referring now to FIG. 3, therein is shown a top view of a panel 302 in a formation phase for manufacture of the integrated circuit packaging system 100 of FIG. 1. Shown is the panel 302 having an assembly side 304. The panel 302 can include a panel sheet or leadframe formed from copper, metal alloys, or materials capable of plating and removal.

The die pad 102 can be formed on the assembly side 304 using a plating process or can be pre-formed and mounted on the panel 302 using an attachment process. The plating process can include a plate-up process such as an electroplating, a diffusion, a precipitation, a vaporization, or combinations thereof.

The attachment process can include forming the die pad 102 on the assembly side 304 using an attachment layer such as a removable thin film or adhesive layer. The leads 104 can be formed on the assembly side 304 or can be pre-formed and mounted on the assembly side 304 using the plating process or the attachment process, respectively.

The panel 302 can include protrusions 306 formed from materials similar to the panel 302. The protrusions 306 can extend from the assembly side 304 to a pre-determined height above the assembly side 304.

The protrusions 306 are shown having a shape of a flat-topped pyramid, as an example. The protrusions 306 can have any shape. As an example, the protrusions 306 can have a shape of a cylinder.

The pre-determined height is specified from user or manufacturing specifications including overall package Z-height requirements, anticipated clearance for wire routing, tool specific wiring rules, or manufacturing equipment requirements.

The flat-topped end of the protrusions 306 facing and furthest away from the assembly side 304 can be formed having a planar surface parallel to the assembly side 304. The elevated contacts 106 can be attached on the flat-topped end of the protrusions 306 in a manner similar to the leads 104 using the plating process or the attachment process, respectively. The exposed surface 128 of the elevated contacts 106 can be facing the protrusions 306.

It has been discovered that the present invention provides the integrated circuit packaging system 100 with process flow efficiency and manufacturing utilization. The die pad 102, the leads 104, and the elevated contacts 106 can be formed on or can be pre-formed and mounted on the assembly side 304 to provide optimize cost and process flows customized to the machinery and technology available to the user.

Figure 4:
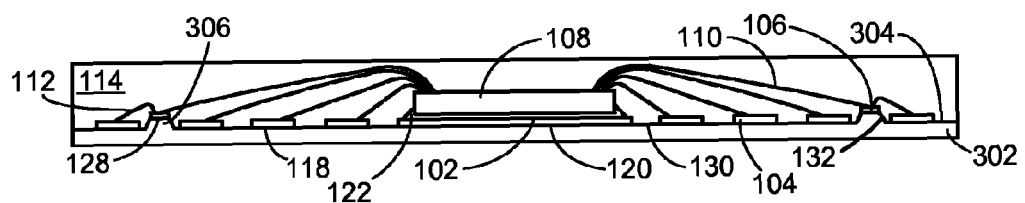
FIG. 4 is a cross-sectional view of the structure of taken along a line 4-4 of FIG. 3 in an encapsulating phase.

Referring now to FIG. 4, therein is shown a cross-sectional view of the structure of taken along a line 4-4 of FIG. 3 in an encapsulating phase. The integrated circuit 108 can be mounted over the side of the die pad 102 opposite the die pad surface 120 using the attachment layer 122 during an attachment process. The interconnects 110 can be attached to the active side of the integrated circuit 108 and the side of the elevated contacts 106 opposite the exposed surface 128 using a connecting process that can include wire bonding, reflowing, sonic, or similar connection processes.

The interconnects 110 can be attached to the active side of the integrated circuit 108 and the side of the leads 104 opposite the lead surface 118 using the connecting process. The jumper interconnects 112 can be attached to the side of the leads 104 opposite the lead surface 118 and the side of the elevated contacts 106 opposite the exposed surface 128 using the connecting process.

The assembly side 304, the integrated circuit 108, the interconnects 110, the jumper interconnects 112, and the protrusions 306 can be covered with the encapsulation 114 during the encapsulating phase. The base side 130 of the encapsulation 114 is formed directly on the assembly side 304 as a result of an encapsulating process to protect the integrated circuit packaging system 100.

The panel 302 can be separated from the encapsulation 114, the lead surface 118, the exposed surface 128, and the die pad surface 120 during a panel removal phase. The panel removal phase can include use of an etching process, a debonding process, a grinding process, a drilling process, or any removal process appropriate for elimination or separation of the panel 302 and the protrusions 306 from the structure of FIG. 4. The integrated circuit packaging system 100 can be formed by the removal of the panel 302.

Figure 5:
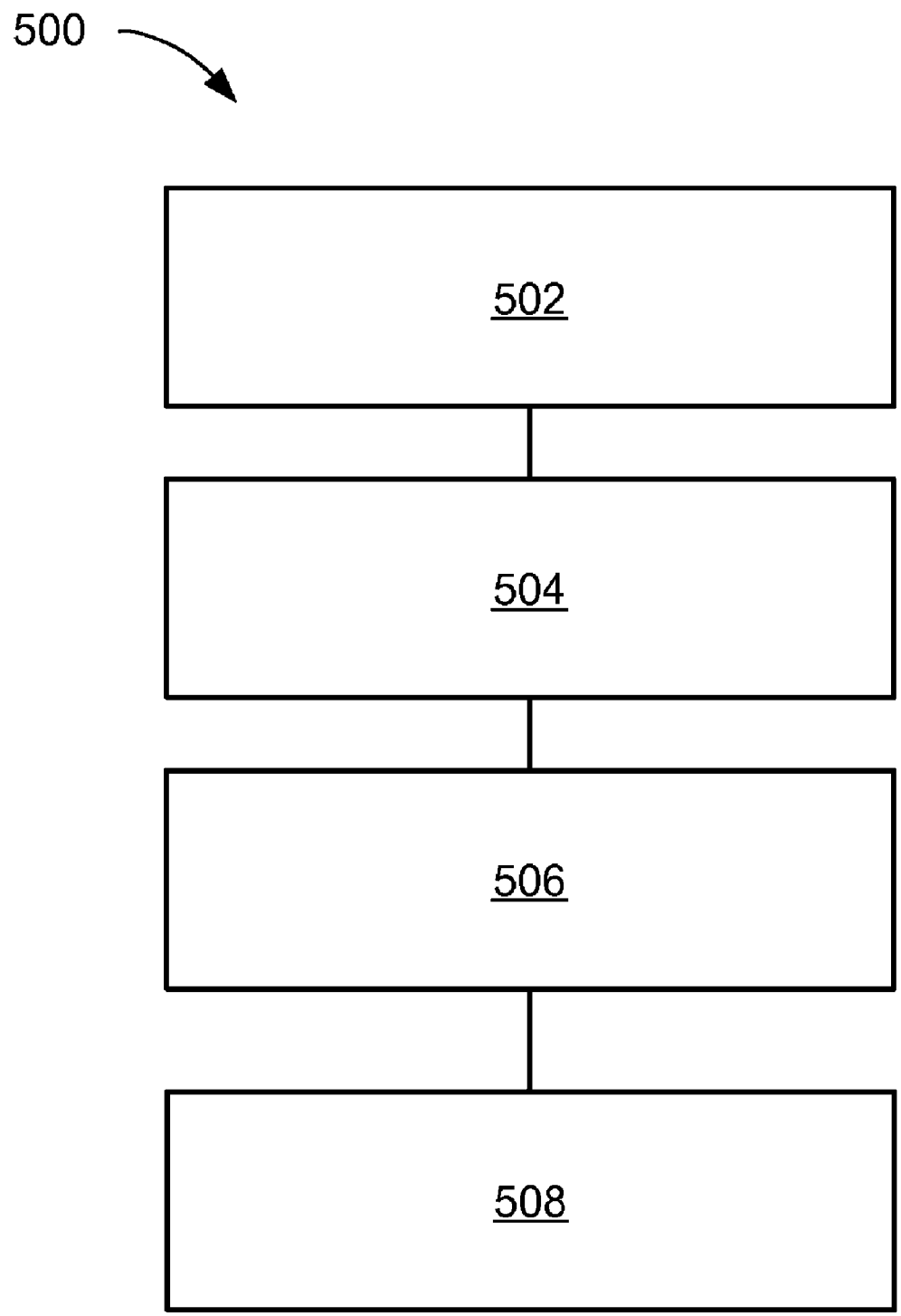
FIG. 5 is a flow chart of a method of manufacture of an integrated circuit packaging system in a further embodiment of the present invention.

Referring now to FIG. 5, therein is shown is a flow chart of a method 500 of manufacture of the integrated circuit packaging system in a further embodiment of the present invention. The method 500 includes forming an elevated contact above and between a lead and a die pad that is coplanar with the lead in a block 502; connecting an integrated circuit and the lead in a block 504; attaching a jumper interconnect between the elevated contact and the lead in a block 506; and forming an encapsulant over the integrated circuit, the lead, the die pad, the elevated contact, and the jumper interconnect, the encapsulant having a recess in a base side with the elevated contact exposed in the recess and the lead exposed from the base side in a block 508.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming an elevated contact above and between a lead and a die pad that is coplanar with the lead;
    connecting an integrated circuit and the lead;

attaching a jumper interconnect between the elevated contact and the lead; and forming an encapsulant over the integrated circuit, the lead, the die pad, the elevated contact, and the jumper interconnect, the encapsulant having a recess in a base side with the elevated contact exposed in the recess and the lead exposed from the base side.

2. The method as claimed in claim 1 wherein attaching the jumper interconnect includes connecting the jumper interconnect to the lead closest to the elevated contact.

3. The method as claimed in claim 1 further comprising:
providing a panel having a protrusion; and wherein:
forming the elevated contact includes forming the elevated contact on the protrusion.

4. The method as claimed in claim 1 further comprising attaching an interconnect between the integrated circuit and the elevated contact.

5. The method as claimed in claim 1 wherein forming the encapsulant includes forming the encapsulant with the recess having a cross-sectional profile of an isosceles trapezoid.

6. A method of manufacture of an integrated circuit packaging system comprising:
forming an elevated contact above and between a lead and a die pad that is coplanar with the lead;
connecting an integrated circuit and the lead;
attaching a jumper interconnect between the elevated contact and the lead; and
forming an encapsulant over the integrated circuit, the lead, the die pad, the elevated contact, and the jumper interconnect, the encapsulant having a recess in a base side with an exposed surface of the elevated contact exposed in the recess and the lead exposed from the base side.

7. The method as claimed in claim 6 wherein attaching the jumper interconnect includes attaching the jumper interconnect on the lead closest to the elevated contact.

8. The method as claimed in claim 6 further comprising:
providing a panel having a protrusion; and wherein:
forming the elevated contact includes forming the elevated contact on the protrusion.

9. The method as claimed in claim 6 further comprising attaching an interconnect between the integrated circuit and the lead.

10. The method as claimed in claim 6 wherein forming the encapsulant includes forming the base side with the die pad exposed.

11. An integrated circuit packaging system comprising:
an elevated contact above and between a lead and a die pad that is coplanar with the lead;
an integrated circuit connected to the lead;
a jumper interconnect attached between the elevated contact and the lead; and
an encapsulant over the integrated circuit, the lead, the die pad, the elevated contact, and the jumper interconnect, the encapsulant having a recess in a base side with the elevated contact exposed in the recess and the lead exposed from the base side.

12. The system as claimed in claim 11 wherein the jumper interconnect includes the jumper interconnect connected to the lead closest to the elevated contact.

13. The system as claimed in claim 11 wherein the encapsulant having the recess adjacent to the lead.

14. The system as claimed in claim 11 further comprising an interconnect attached between the integrated circuit and the elevated contact.

15. The system as claimed in claim 11 wherein the encapsulant includes the encapsulant having the recess with a cross-sectional profile of an isosceles trapezoid.

16. The system as claimed in claim 11 wherein the elevated contact is not coplanar with the lead.

17. The system as claimed in claim 16 further comprising:
a further lead; and wherein:
the elevated contact is between the lead and the further lead.

18. The system as claimed in claim 16 wherein the encapsulant includes the encapsulant formed with the die pad exposed.

19. The system as claimed in claim 16 further comprising an interconnect attached between the integrated circuit and the lead.

20. The system as claimed in claim 16 further comprising:
a further lead coplanar with the lead; and wherein:
the elevated contact is between the lead and the further lead.

* * * * *